(12) United States Patent
Kum et al.

(10) Patent No.: US 11,251,391 B2
(45) Date of Patent: Feb. 15, 2022

(54) LIGHT EMITTING DIODE AND ELECTROLUMINESCENT DISPLAY DEVICE INCLUDING THE SAME

(71) Applicant: LG Display Co., Ltd., Seoul (KR)

(72) Inventors: Tae-Il Kum, Paju-si (KR); Tae-Sun Yoo, Paju-si (KR); Shin-Han Kim, Paju-si (KR); Ji-Young Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 178 days.

(21) Appl. No.: 16/533,362

(22) Filed: Aug. 6, 2019

(65) Prior Publication Data

US 2020/0052234 A1 Feb. 13, 2020

(30) Foreign Application Priority Data

Aug. 7, 2018 (KR) .................. 10-2018-0091753

(51) Int. Cl.
*H01L 51/50* (2006.01)
*H01L 27/32* (2006.01)
*H01L 51/00* (2006.01)

(52) U.S. Cl.
CPC .......... *H01L 51/504* (2013.01); *H01L 27/322* (2013.01); *H01L 27/3244* (2013.01); *H01L 51/0067* (2013.01); *H01L 51/0071* (2013.01); *H01L 51/0072* (2013.01); *H01L 51/5056* (2013.01); *H01L 51/5072* (2013.01); *H01L 51/5088* (2013.01); *H01L 51/5092* (2013.01);
(Continued)

(58) Field of Classification Search
None
See application file for complete search history.

(56) References Cited

U.S. PATENT DOCUMENTS

2016/0043327 A1\* 2/2016 Yoo ..................... H01L 51/0058
257/40
2017/0092870 A1 3/2017 Kim et al.

FOREIGN PATENT DOCUMENTS

| CN | 102034934 A | 4/2011 |
| CN | 104953036 A | 9/2015 |
| CN | 105321984 A | 2/2016 |

(Continued)

OTHER PUBLICATIONS

Deng, "Study on the effect of charge generation layer on the performance of laminated organic light-emitting devices", No. 9, Sep. 17, 2014 w/English Abstract (157 pages).

(Continued)

*Primary Examiner* — Gregory D Clark
(74) *Attorney, Agent, or Firm* — Polsinelli PC

(57) ABSTRACT

A light emitting diode comprises first and second electrodes facing each other; a first charge generation layer between the first and second electrodes; a first emitting stack including a first emitting material layer between the first electrode and the first charge generation layer and a first electron transporting layer between the first emitting material layer and the first charge generation layer; and a second emitting stack including a second emitting material layer between the first charge generation layer and the second electrode and a second electron transporting layer between the second emitting material layer and the second electrode, wherein the first charge generation layer has an electron mobility lower than that of the first electron transporting layer.

20 Claims, 3 Drawing Sheets

(52) U.S. Cl.
CPC .......... *H01L 2251/5307* (2013.01); *H01L 2251/5315* (2013.01); *H01L 2251/558* (2013.01)

(56) References Cited

FOREIGN PATENT DOCUMENTS

| | | |
|---|---|---|
| CN | 106469744 A | 3/2017 |
| CN | 106611822 A | 5/2017 |
| CN | 107611270 A | 1/2018 |
| CN | 107887520 A | 4/2018 |
| KR | 10-2004-0094842 A | 11/2004 |
| KR | 10-2008-0092581 A | 1/2016 |
| WO | 2018/124588 A1 | 7/2018 |

OTHER PUBLICATIONS

Chinese Office Action dated Sep. 28, 2021 issued in corresponding Patent Application No. 201910726956.2 w/English Translation (20 pages).

* cited by examiner

LIGHT EMITTING DIODE AND ELECTROLUMINESCENT DISPLAY DEVICE INCLUDING THE SAME

CROSS REFERENCE TO RELATED APPLICATION

The present application claims the benefit of Korean Patent Application No. 10-2018-0091753, filed on Aug. 7, 2018, which is hereby incorporated by reference in its entirety.

BACKGROUND

Field of the Disclosure

The present disclosure relates to a light emitting diode, and more particularly, to a light emitting diode having improved stability in a high temperature condition and an electroluminescent display device including the same.

Description of the Background

Recently, requirement for flat panel display devices having small occupied area is increased. Among the flat panel display devices, a technology of an electroluminescent (EL) display device, which includes an emitting diode and may be called to an organic light emitting display (OLED) device, is rapidly developed.

The emitting diode emits light by injecting electrons from a cathode as an electron injection electrode and holes from an anode as a hole injection electrode into an emitting layer, combining the electrons with the holes, generating an exciton, and transforming the exciton from an excited state to a ground state. A flexible transparent substrate, for example, a plastic substrate, can be used as a base substrate where elements are formed. In addition, the emitting diode can be operated at a voltage (e.g., 10V or below) lower than a voltage required to operate other display devices and has low power consumption. Moreover, the light from the emitting diode has excellent color purity.

The emitting layer may have a single-layered structure of an emitting material layer (EML). Alternatively, to improve the emission efficiency, the emitting layer may have a multi-layered structure. For example, the emitting layer may include a hole injection layer (HIL), a hole transporting layer (HTL), the EML, an electron transporting layer (ETL) and an electron injection layer (EIL).

For example, in the EL display device, a red emitting layer, a green emitting layer and a blue emitting layer is respectively formed in a red pixel region, a green pixel region and a blue pixel region such that red, green and blue light is emitted from the red, green and blue pixel regions. As a result, a full color image is provided.

However, there is a limitation in the above method of forming the red, green and blue emitting layers in the red, green and blue pixel regions, respectively, for a large-size EL display device. To overcome the limitation, an EL display device, where a white emitting diode is formed on the red, green and blue pixel regions and a color filter is formed, is introduced.

For example, an emitting stack including a yellow-green emitting layer and an emitting stack including a blue emitting layer are formed between the anode and the cathode, and the white light is emitted from the emitting diode. The white light passes through the color filter such that a color image is provided.

However, in the multi-stack emitting diode and the EL display device, the lifespan is significantly decreased.

SUMMARY

The present disclosure is directed to an emitting diode and an EL display device including the same that substantially obviate one or more of the problems associated with the limitations and disadvantages of the related conventional art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the aspects of the present disclosure, as described herein, an emitting diode comprising first and second electrodes facing each other; a first charge generation layer between the first and second electrodes; a first emitting stack including a first emitting material layer between the first electrode and the first charge generation layer and a first electron transporting layer between the first emitting material layer and the first charge generation layer; and s second emitting stack including a second emitting material layer between the first charge generation layer and the second electrode and a second electron transporting layer between the second emitting material layer and the second electrode, wherein an electron mobility of the first charge generation layer is smaller than an electron mobility of the first electron transporting layer is provided.

Another aspect of the present disclosure is an electroluminescent display device comprising a substrate; an emitting diode on the substrate, the emitting diode including: first and second electrodes facing each other; a first charge generation layer between the first and second electrodes; a first emitting stack including a first emitting material layer between the first electrode and the first charge generation layer and a first electron transporting layer between the first emitting material layer and the first charge generation layer; and s second emitting stack including a second emitting material layer between the first charge generation layer and the second electrode and a second electron transporting layer between the second emitting material layer and the second electrode; a thin film transistor positioned between the substrate and the emitting diode and connected to the emitting diode, wherein an electron mobility of the first charge generation layer is smaller than an electron mobility of the first electron transporting layer.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this application, illustrate aspects of the present disclosure and together with the description serve to explain the principles of the present disclosure.

In the drawings.

DETAILED DESCRIPTION

Reference will now be made in detail to some of the examples and aspects, which are illustrated in the accompanying drawings.

Figure 1:
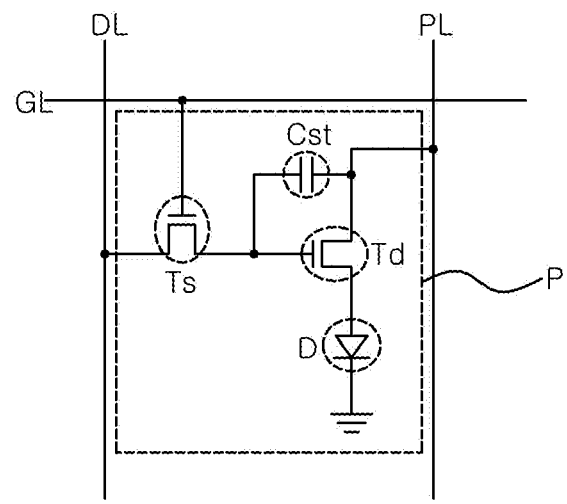
FIG. 1 is a schematic circuit diagram of an EL display device of the present disclosure.

FIG. 1 is a schematic circuit diagram of an EL display device of the present disclosure.

As shown in FIG. 1, an EL display device includes a gate line GL, a data line DL, a power line PL, a switching thin film transistor TFT Ts, a driving TFT Td, a storage capacitor Cst, and an emitting diode D. The gate line GL and the data line DL cross each other to define a pixel region SP.

The switching TFT Ts is connected to the gate line GL and the data line DL, and the driving TFT Td and the storage capacitor Cst are connected to the switching TFT Ts and the power line PL. The emitting diode D is connected to the driving TFT Td.

In the EL display device, when the switching TFT Ts is turned on by a gate signal applied through the gate line GL, a data signal from the data line DL is applied to the gate electrode of the driving TFT Td and an electrode of the storage capacitor Cst.

When the driving TFT Td is turned on by the data signal, an electric current is supplied to the emitting diode D from the power line PL. As a result, the emitting diode D emits light. In this case, when the driving TFT Td is turned on, a level of an electric current applied from the power line PL to the emitting diode D is determined such that the emitting diode D can produce a gray scale.

The storage capacitor Cst serves to maintain the voltage of the gate electrode of the driving TFT Td when the switching TFT Ts is turned off. Accordingly, even if the switching TFT Ts is turned off, a level of an electric current applied from the power line PL to the emitting diode D is maintained to next frame.

As a result, the EL display device displays a desired image.

Figure 2:
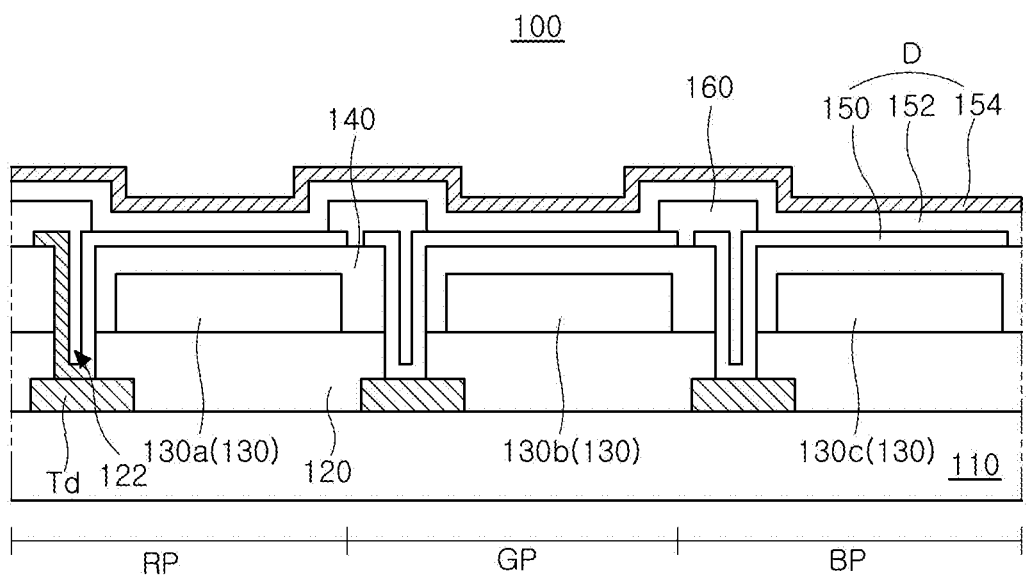
FIG. 2 is a schematic cross-sectional view of a bottom-emission type EL display device of the present disclosure.

FIG. 2 is a schematic cross-sectional view of a bottom-emission type EL display device of the present disclosure.

As shown in FIG. 2, the EL display device 100 includes a substrate 110, an emitting diode D over the substrate 110, a driving TFT Td, which is positioned between the substrate 110 and the emitting diode D and connected to the emitting diode D, and a color filter 130 between the substrate 110 and the emitting diode D.

The substrate 110 may be a glass substrate or a plastic substrate. For example, the substrate 110 may be a polyimide substrate.

A red pixel region RP, a green pixel region GP and a blue pixel region BP are defined on the substrate 110, and the driving TFT Td is disposed in each of the red, green and blue pixel regions RP, GP and BP. A white pixel region (not shown) may be further defined on the substrate 110. In this instance, the driving TFT Td is also disposed in the white pixel region.

For example, the driving TFT Td may include a semiconductor layer on the substrate 110, a gate electrode, which is disposed over the semiconductor layer and overlaps the semiconductor layer, a source electrode, which is disposed over the gate electrode and connected one end of the semiconductor layer, and a drain electrode, which is disposed over the gate electrode and connected to the other end of the semiconductor layer. The source and drain electrodes are spaced apart from each other.

A first insulating layer 120 is formed on the driving TFT Td, and the color filter 130 is formed on the first insulating layer 120. The color filter 130 includes a red color filter pattern 130a corresponding to the red pixel region RP, a green color filter pattern 130b corresponding to the green pixel region GP and a blue color filter pattern 130c corresponding to the blue pixel region BP.

A second insulating layer 140 is formed on the color filter 130. A contact hole 122, which exposes an electrode, e.g., the drain electrode, of the driving TFT Td, is formed through the first and second insulating layers 120 and 140.

Namely, the color filter 130 is positioned between the first and second insulating layers 120 and 140 such that the first and second insulating layers 120 and 140 are spaced apart from each other in an emission area of the red, green and blue pixel regions RP, GP and BP. When the white pixel regions is further defined, there is no color filter in the white pixel region such that the first and second insulating layers 120 and 140 contact each other in an entire of the white pixel region.

A first electrode 150, which is connected to the driving TFT Td through the contact hole 122, is formed on the second insulating layer 140. The first electrode 150 is separated in each of the red, green and blue pixel regions RP, GP and BP. The first electrode 150 may serve as an anode and include a conductive material having relatively high work function. For example, the first electrode 150 may be formed or include a transparent conductive material such as indium-tin-oxide (ITO), indium-zinc-oxide (IZO) or zinc oxide (ZnO).

A bank 160 covering an edge of the first electrode 150 is formed on the second insulating layer 140. The bank 160 exposes a center of the first electrode 150 in the red, green and blue pixel regions RP, GP and BP.

An emitting layer 152 is formed on the first electrode 150. The emitting layer 152 emits white light and is continuously formed on an entire display area, which include the red, green and blue pixel regions RP, GP and BP, as one body. Namely, the emitting layer 152 is formed to cover an entire surface of the bank 160 such that the emitting layer 152 in adjacent pixel regions is continuous.

A second electrode 154 is formed over the substrate 110 including the emitting layer 152. The second electrode 154 covers an entire display area. The second electrode 154 may be formed of or include a conductive material having relatively low work function to serve as a cathode. For example, the second electrode 154 may be formed of aluminum (Al), magnesium (Mg) or Al—Mg alloy.

The first electrode 150, the emitting layer 152 and the second electrode 154 constitute the emitting diode D.

Although not shown, an encapsulation film may be formed on the second electrode 154 to prevent penetration of moisture into the emitting diode D. The encapsulation film may include a first inorganic insulating layer, an organic insulating layer and a second inorganic insulating layer sequentially stacked, but it is not limited thereto. In addition, a polarization plate for reducing an ambient light reflection may be disposed at an outer side of the substrate 110. For example, the polarization plate may be a circular polarization plate.

A cover window (not shown) may be attached on an outer side of the substrate 110 or the polarization plate. The substrate 110 and the cover window may have flexibility such that a flexible EL display device may be provided.

The EL display device of FIG. 2 is a bottom-emission type. Namely, the light from the emitting layer 152 passes through the first electrode 150 and the color filter 130 such that an image is displayed on a side of the substrate 110.

Namely, the first electrode 150 is a transparent electrode, and the second electrode 154 is a reflective electrode. The light from the emitting layer 152 may directly pass through the first electrode 150 or indirectly pass through the first electrode 150 after being reflected on the second electrode 154.

In FIG. 2, the color filter 130 is positioned between the first and second insulating layers 120 and 140. However, a position of the color filter 130 is not restricted thereto in a space between the emitting diode D and the substrate 110. For example, the color filter 130 may be positioned between the substrate 110 and the first insulating layer 120. In this instance, the second insulating layer 140 may be omitted.

Since the white light from the emitting diode D passes through the color filter 130, the EL display device 100 displays a full color image.

Figure 3:
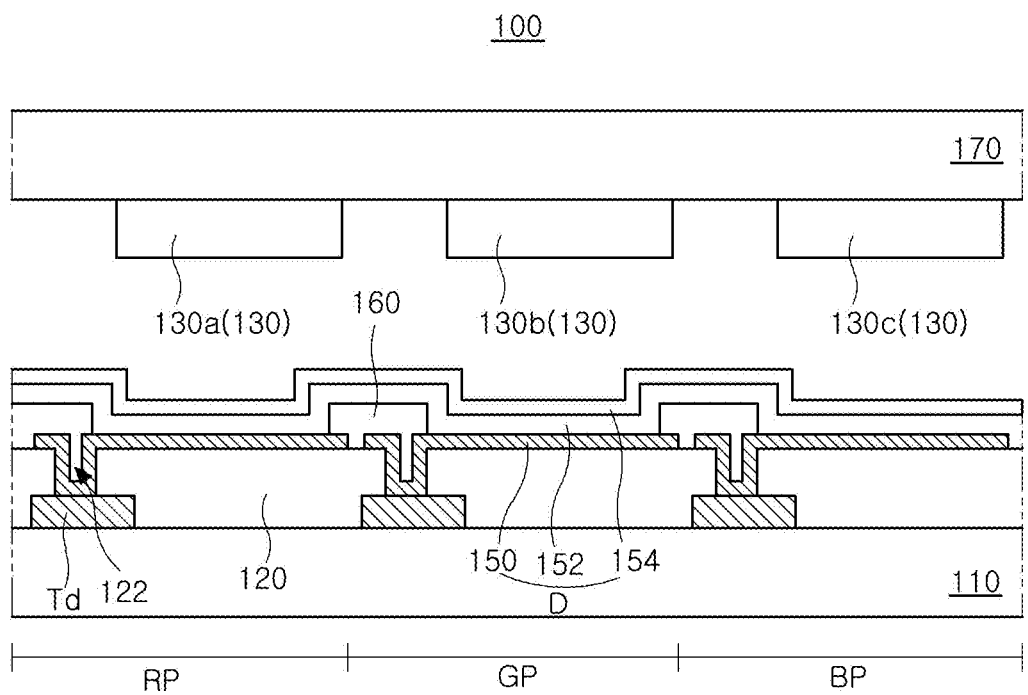
FIG. 3 is a schematic cross-sectional view of a top-emission type EL display device of the present disclosure.

FIG. 3 is a schematic cross-sectional view of a top-emission type EL display device of the present disclosure.

As shown in FIG. 3, the EL display device 100 includes a first substrate 110, a second electrode 170 facing the first electrode 110, an emitting diode D over the first substrate 110, a driving TFT Td, which is positioned between the first substrate 110 and the emitting diode D and connected to the emitting diode D, and a color filter 130 between the second substrate 170 and the emitting diode D.

Each of the first and second substrates 110 and 170 may be a glass substrate or a plastic substrate. For example, each of the first and second substrates 110 and 170 may be a polyimide substrate.

A red pixel region RP, a green pixel region GP and a blue pixel region BP are defined on the first substrate 110, and the driving TFT Td is disposed in each of the red, green and blue pixel regions RP, GP and BP. A white pixel region (not shown) may be further defined on the first substrate 110. In this instance, the driving TFT Td is also disposed in the white pixel region.

For example, the driving TFT Td may include a semiconductor layer on the first substrate 110, a gate electrode, which is disposed over the semiconductor layer and overlaps the semiconductor layer, a source electrode, which is disposed over the gate electrode and connected one end of the semiconductor layer, and a drain electrode, which is disposed over the gate electrode and connected to the other end of the semiconductor layer. The source and drain electrodes are spaced apart from each other.

An insulating layer 120 is formed on the driving TFT Td, and a contact hole 122, which exposes an electrode, e.g., the drain electrode, of the driving TFT Td, is formed through the insulating layer 120.

A first electrode 150, which is connected to the driving TFT Td through the contact hole 122, is formed on the insulating layer 120. The first electrode 150 is separated in each of the red, green and blue pixel regions RP, GP and BP. The first electrode 150 may serve as an anode and include a conductive material having relatively high work function. For example, the first electrode 150 may include a transparent electrode layer, which may be formed or include a transparent conductive material such as indium-tin-oxide (ITO), indium-zinc-oxide (IZO) or zinc oxide (ZnO), and a reflection electrode layer (or reflection layer). The first electrode 150 may have a triple-layered structure of upper and lower layers of ITO and a middle layer of aluminum-palladium-copper (APC) alloy.

A bank 160 covering an edge of the first electrode 150 is formed on the insulating layer 120. The bank 160 exposes a center of the first electrode 150 in the red, green and blue pixel regions RP, GP and BP.

An emitting layer 152 is formed on the first electrode 150. The emitting layer 152 emits white light and is continuously formed on an entire display area, which include the red, green and blue pixel regions RP, GP and BP, as one body. Namely, the emitting layer 152 is formed to cover an entire surface of the bank 160 such that the emitting layer 152 in adjacent pixel regions is continuous.

A second electrode 154 is formed over the substrate 110 including the emitting layer 152. The second electrode 154 covers an entire display area. The second electrode 154 may be formed of or include a conductive material having relatively low work function to serve as a cathode. For example, the second electrode 154 may be formed of aluminum (Al), magnesium (Mg) or Al—Mg alloy and may have a thin profile to transmit the light.

The first electrode 150, the emitting layer 152 and the second electrode 154 constitute the emitting diode D.

A color filter 130 is formed over the emitting diode D. Namely, the color filter 130 is positioned between the emitting diode D and the second substrate 170. The color filter 130 includes a red color filter pattern 130a corresponding to the red pixel region RP, a green color filter pattern 130b corresponding to the green pixel region GP and a blue color filter pattern 130c corresponding to the blue pixel region BP.

Although not shown, a polarization plate for reducing an ambient light reflection may be disposed at an outer side of the second substrate 170. For example, the polarization plate may be a circular polarization plate.

The EL display device of FIG. 3 is a top-emission type. Namely, the light from the emitting layer 152 passes through the second electrode 154 and the color filter 130 such that an image is displayed on a side of the second substrate 170.

Namely, the first electrode 150 is a reflective electrode, and the second electrode 154 is a transparent (semi-transparent) electrode. The light from the emitting layer 152 may directly pass through the second electrode 154 or indirectly pass through the second electrode 154 after being reflected on the first electrode 150.

Since the white light from the emitting diode D passes through the color filter 130, the EL display device 100 displays a full color image.

Figure 4:
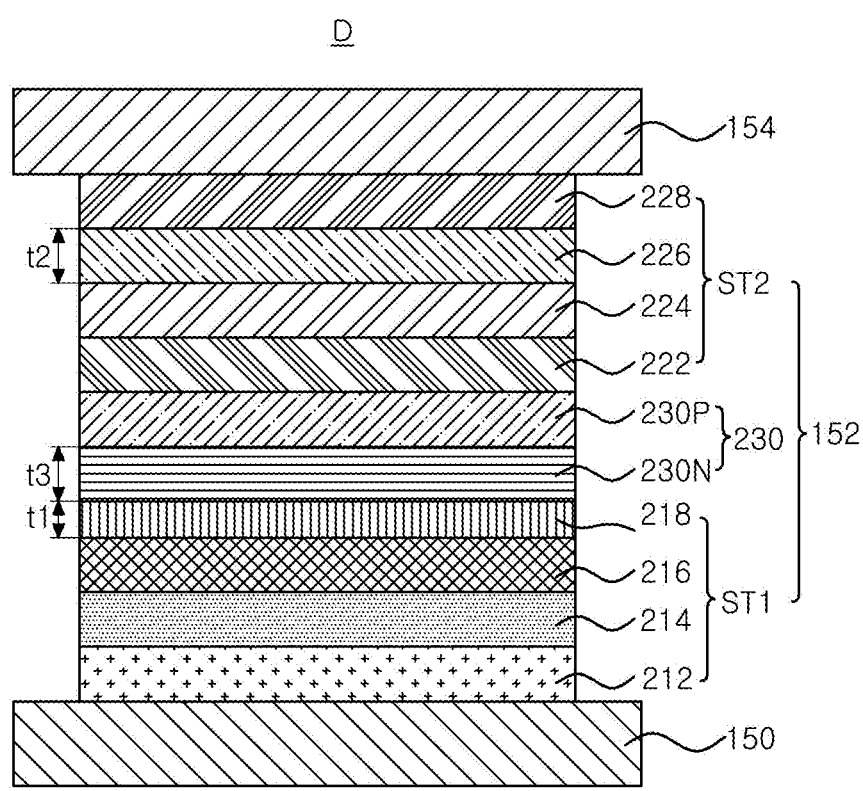
FIG. 4 is a schematic cross-sectional view of a two-stack emitting diode of the present disclosure.

FIG. 4 is a schematic cross-sectional view of a two-stack emitting diode of the present disclosure.

As shown in FIG. 4, the emitting diode D includes a first electrode 150, a second electrode 154 facing the first electrode 150 and an emitting layer 152 between the first and second electrodes 150 and 154, and the emitting layer 152 includes first and second emitting stacks ST1 and ST2 and a charge generation layer (CGL) 230.

The first electrode 150 may serve as an anode for injecting the hole and may include a conductive material having high work function, e.g., ITO, IZO or ZnO. The second electrode 154 may serve as a cathode for injecting the electrode and may include a conductive material having low work function, e.g., Al, Mg or Al—Mg alloy.

When the emitting diode D is a bottom-emission type, the second electrode 154 serves as a reflection electrode. On the other hand, when the emitting diode D is a top-emission type, the first electrode 150 may further include a reflection layer or a reflection electrode, and the second electrode 154 serves as a transparent electrode.

The CGL 230 is positioned between the first and second emitting stacks ST1 and ST2, and the first emitting stack ST1, the CGL 230 and the second emitting stack ST2 are sequentially stacked on the first electrode 150. Namely, the first emitting stack ST1 is positioned between the first electrode 150 and the CGL 230, and the second emitting stack ST2 is positioned between the second electrode 150 and the CGL 230.

The first emitting stack ST1, which is positioned between the first electrode 150 and the CGL 230, includes a first emitting material layer (EML) 216 and a first electrode transporting layer (ETL) 218 between the first EML 216 and the CGL 230. In addition, the first emitting stack ST1 may further include at least one of a hole injection layer (HIL) 212 and a first hole transporting layer (HTL) 214 sequentially stacked on the first electrode 150. Namely, the HIL 212 and the first HTL 214 are positioned between the first electrode 150 and the first EML 216, and the HIL 212 is positioned between the first electrode 150 and the first HTL 214.

The second emitting stack ST2 includes a second EML 224 between the CGL 230 and the second electrode 154 and a second ETL 226 between the second EML 224 and the second electrode 154. In addition, the second emitting stack ST2 may further include at least one of a second HTL 222 between the CGL 230 and the second EML 224 and an electron injection layer (EIL) 228 between the second ETL 226 and the second electrode 154.

The CGL 230 is positioned between the first and second emitting stacks ST1 and ST2. Namely, the first and second emitting stacks ST1 and ST2 are connected through the CGL 230. The CGL 230 may be a P-N junction CGL of an N-type CGL 230N and a P-type CGL 230P.

The N-type CGL 230N is positioned between the first ETL 218 and the second HTL 222, and the P-type CGL 230P is positioned between the N-type CGL 230N and the second HTL 222.

The CGL 230 generates charges or separates the holes and the electrons such that the electron and the hole are provided into the first and second emitting stacks ST1 and ST2, respectively.

Namely, the N-type CGL 230N provides the electron into the first ETL 218 of the first emitting stack ST1, and the first ETL 218 provides the electron into the first EML 216. The P-type CGL 230P provides the hole into the second HTL 222 of the second emitting stack ST2, and the second HTL 222 provides the hole into the second EML 224. Accordingly, in the emitting diode D including a plurality of emitting layers, the emitting efficiency is improved, and the driving voltage is lowered.

The hole injection from the first electrode 150 into the first EML 216 is improved by the HIL 212. The HIL 212 may include at least one selected from the group consisting of copper phthalocyanine (CuPC), poly(3,4)-ethylenedioxythiophene (PEDOT) and polyaniline, but it is not limited thereto.

A hole transporting is improved by the first and second HTLs 214 and 222. Each of the first and second HTLs 214 and 222 may include at least one selected from the group consisting of N,N'-bis(naphthalen-1-yl)-N,N'-bis(phenyl)-2,2'-dimethylbenzidine (NPD), N,N'-bis-(3-methylphenyl)-N,N'-bis-(phenyl)-benzidine (TPD), 2,2',7,7'-tetrakis(N,N-diphenylamino)-9,9'-spirofluorene (spiro-TAD) and 4,4',4''-Tris(N-3-methylphenyl-N-phenylamino)-triphenylamine (MTDATA), but it is not limited thereto.

The first EML 216 may be a blue EML, and the second EML 224 may be a yellow-green EML. The second EML 224 may further include a red EML to have a double-layered structure.

The blue EML may include a fluorescent emitting material. For example, the blue EML may include anthracene-based host and pyrene-based dopant with about 10 to 30 wt %. However, it is not limited thereto.

The yellow green EML may include host, which is 4,4'-bis(carbazol-9-yl)biphenyl (CBP) or bis(2-methyl-8-quinolinolate)-4-(phenylphenolato)aluminum (BAlq), and phosphorescent yellow-green dopant with about 10 to 30 wt %. However, it is not limited thereto.

The red EML may include host, e.g., CBP, and dopant of iridium complete with about 10 to 30 wt %. However, it is not limited thereto.

An electron injection is improved by the EIL 228. The EIL 228 may include at least one selected from the group consisting of tris(8-hydroxy-quinolinato)aluminum (Alq3), 2-(4-biphenyl)-5-(4-tertbutylphenyl)-1,3,4-oxadiazole (PBD), 3-(4-biphenyl)-4-phenyl-5-tertbutylphenyl-1,2,4-triazole TAZ) and Bis(2-methyl-8-quinolinolate)-4-(phenylphenolato)aluminum (BAlq), but it is not limited thereto. On the other hand, the EIL 228 may further include a metal compound. For example, the metal compound may be at least one selected from the group consisting of LiF, NaF, KF, RbF, CsF, FrF, $BeF_2$, $MgF_2$, $CaF_2$, $SrF_2$, $BaF_2$ and $RaF_2$, but it is not limited thereto.

The first ETL 218 includes an electron transporting material of Formula 1, and the second ETL 226 includes an electron transporting material selected from the group consisting of the compound of Formula 1, tris(8-hydroxy-quinolinato)aluminum (Alq3), 2-(4-biphenyl)-5-(4-tert-butylphenyl)-1,3,4-oxadiazole (PBD), 3-(4-biphenyl)-4-phenyl-5-tertbutylphenyl-1,2,4-triazole TAZ) and Bis(2-methyl-8-quinolinolate)-4-(phenylphenolato)aluminum (BAlq). The material of the first ETL 218 and the material of the second ETL 226 may be same or different.

[Formula 1]

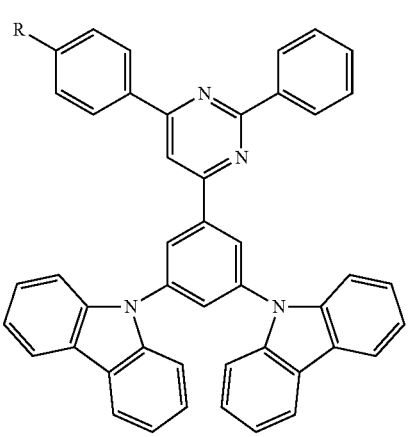

In Formula 1, R is C6 to C30 aryl group. For example, R may be phenyl.

The electron transporting material of Formula 1 may be a material in Formula 2.

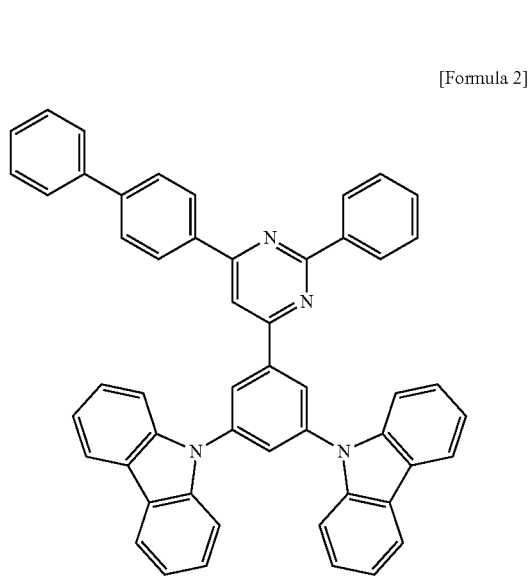 [SMILES: c1ccc(-c2ccc(-c3cc(-c4cc(-n5c6ccccc6c6ccccc65)cc(-n5c6ccccc6c6ccccc65)c4)nc(-c4ccccc4)n3)cc2)cc1]

[Formula 2]

The electron transporting material of Formula 1 or 2 has high durability or reliability against the hole such that thermal degradation of the first ETL 218 and/or the second ETL 226. Accordingly, the lifespan of the emitting diode D is improved.

The P-type CGL 230P includes a quinolone-based compound.

The N-type CGL 230N includes a material of Formula 3.

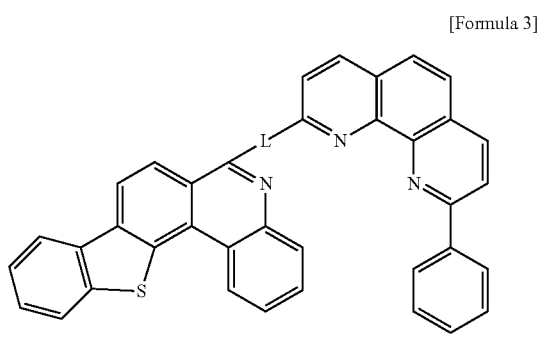

[Formula 3]

In Formula 3, L is C6 to C30 arylene group. For example, L may be phenylene.

The material of Formula 3 may be a material in Formula 4.

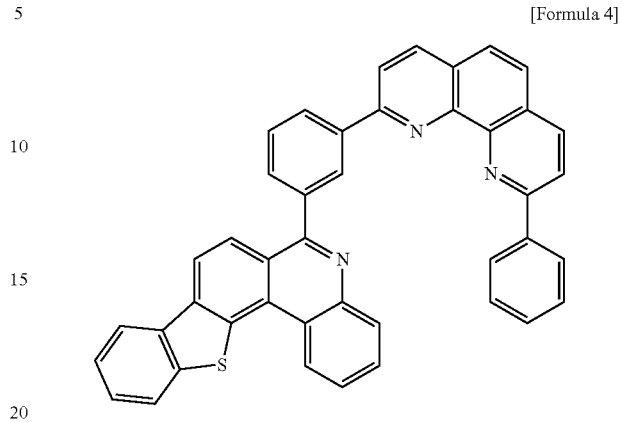

[Formula 4]

The material of Formula 3 or 4 for the N-type CGL 230N has high stability in high temperature such that thermal degradation of the emitting diode D in high temperature is prevented.

For example, the first ETL 218 may include the material of Formula 2, and the electron transporting material of Formula 2 has an electron mobility of approximately $1*10^{-6}$ cm$^2$/Vs~$1*10^{-5}$ cm$^2$/Vs. The N-type CGL 230N may include the material of Formula 4, and the material of Formula 4 has an electron mobility of approximately $5*10^{-5}$ cm$^2$/Vs~$1*10^{-4}$ cm$^2$/Vs. Namely, the electron mobility of the N-type CGL 230N is greater than that of the first ETL 218.

On the other hand, to efficiently provide the electron from the CGL 230 into the first EML 216, the electron mobility of the first ETL 218 is required to be greater than that of the CGL 230.

To meet the above condition, an electron transporting material including a triazine core and a material including a phenanthroline core may be used to the first ETL and the N-type CGL, respectively.

However, the electron transporting material including the triazine core has low durability or reliability against the hole, and the material including the phenanthroline core has low stability in high temperature. Accordingly, in the emitting diode including a combination of the first ETL, which includes the electron transporting material including the triazine core, and the N-type CGL, which includes the material including the phenanthroline core, the electron mobility property in high temperature is significantly changed (deviated). Namely, a voltage difference depending on the temperature is increased such that the lifespan of the emitting diode in high temperature is decreased.

However, in the emitting diode D of the present disclosure, the first ETL 218 includes the electron transporting material, which includes pyrimidine core, having high durability or reliability against the hole, and the N-type CGL 230N includes the material having high stability in high temperature. As a result, the lifespan decrease of the emitting diode D in high temperature is prevented.

On the other hand, in the emitting diode including a combination of the first ETL 218, which includes the electron transporting material of Formula 1 or 2, and the N-type CGL, which includes the material of Formula 3 or 4, the electron mobility of the N-type CGL 230N is greater than that of the first ETL 218, the electron transport may be blocked such that the emitting efficiency of the emitting diode D may be decreased. Namely, the electron transport into the first EML 216, which is a blue fluorescent emitting layer having relatively low emitting efficiency, is blocked such that the emitting efficiency of the emitting diode D may be decreased.

However, in the emitting diode D of the present disclosure, since a thickness of the first ETL 218 is reduced, a tunneling effect is provided such that the problem of the electron transport is prevented.

Namely, the first ETL 218 has a first thickness t1, and the second ETL 226, which is adjacent to the second electrode 154 as the cathode, has a second thickness t2, which is greater than the first thickness t1. The N-type CGL 230N has a third thickness t3 being greater than the first thickness t1. For example, the first thickness t1 may be approximately 30 to 150 Å, and each of the second and third thicknesses t2 and t3 may be approximately 150 to 300 Å. The first thickness t1 of the first ETL 218 may be approximately 30 to 100 Å.

In the emitting diode D of the present disclosure, the first ETL 218 includes the electron transporting material of Formula 1 or 2, and the N-type CGL 230N includes the material of Formula 3 or 4. As a result, the lifespan decrease of the emitting diode D in high temperature is prevented. In addition, since the first ETL 218, which has relatively low electron mobility, has relatively thin profile, the emitting efficiency decrease of the emitting diode D is prevented.

Figure 5:
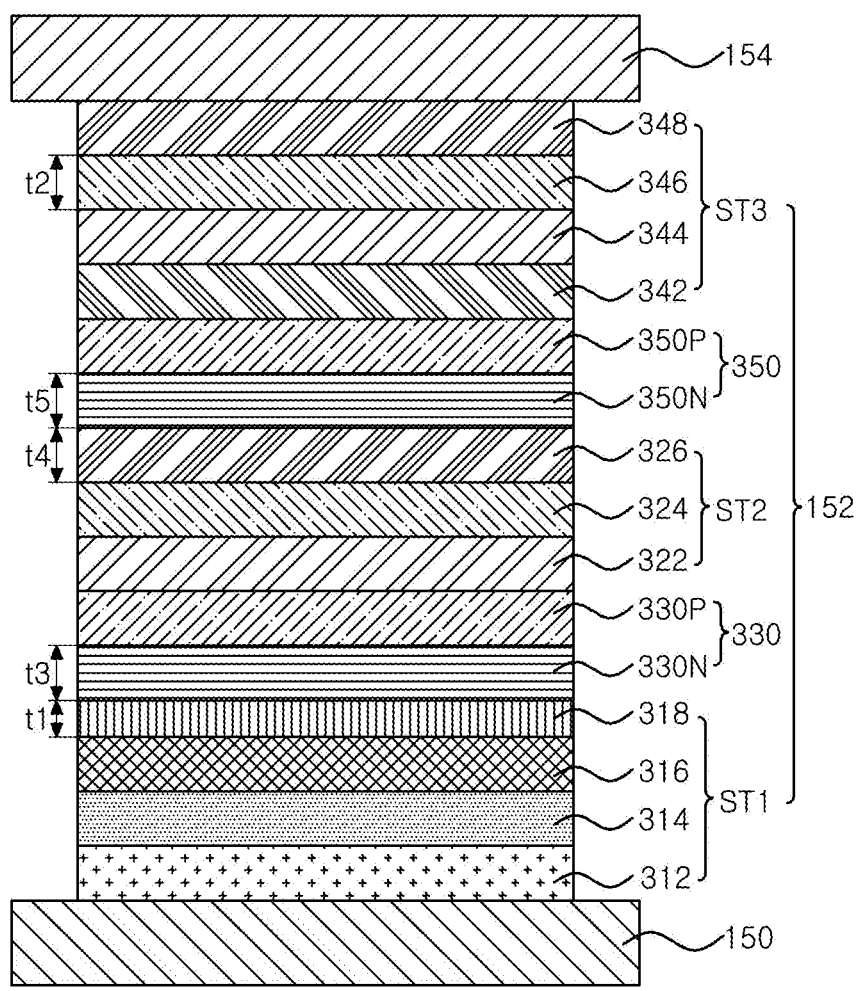
FIG. 5 is a schematic cross-sectional view of a three-stack emitting diode of the present disclosure.

FIG. 5 is a schematic cross-sectional view of a three-stack emitting diode of the present disclosure.

As shown in FIG. 5, an emitting diode D includes a first electrode 150, a second electrode 154, an emitting layer 152 between the first and second electrodes 150 and 154, and the emitting layer 152 includes first to third emitting parts ST1, ST2 and ST3 and first and second charge generation layers (CGLs) 330 and 350. Alternatively, four or more emitting parts and three or more CGLs may be disposed between the first and second electrodes 140 and 144.

The first electrode 150 may serve as an anode for injecting the hole and may include a conductive material having high work function, e.g., ITO, IZO or ZnO. The second electrode 154 may serve as a cathode for injecting the electrode and may include a conductive material having low work function, e.g., Al, Mg or Al—Mg alloy.

When the emitting diode D is a bottom-emission type, the second electrode 154 serves as a reflection electrode. On the other hand, when the emitting diode D is a top-emission type, the first electrode 150 may further include a reflection layer or a reflection electrode, and the second electrode 154 serves as a transparent electrode.

The first and second CGLs 330 and 350 are positioned between the first and second emitting parts ST1 and ST2 and the second and third emitting parts ST2 and ST3, respectively. Namely, the first emitting part ST1, the first CGL 330, the second emitting part ST2, the second CGL 350 and the third emitting part ST3 are sequentially stacked on the first electrode 150. In other words, the first emitting part ST1 is positioned between the first electrode 150 and the first CGL 330, and the second emitting part ST2 is positioned between the First and Second CGLs 330 and 350. In addition, the third emitting part ST3 is positioned between the second electrode 154 and the second CGL 350.

The first emitting part ST1 may include a first EML 316 and a first ETL 318 between the first EML 316 and the first CGL 330. In addition, the first emitting stack ST1 may further include at least one of an HIL 312 and a first HTL 314 sequentially stacked on the first electrode 150. Namely, the HIL 312 and the first HTL 314 are positioned between the first electrode 150 and the first EML 316, and the HIL 312 is positioned between the first electrode 150 and the first HTL 314.

The second emitting stack ST2 includes a second EML 324 between the first CGL 330 and the second CGL 350 and a second ETL 326 between the second EML 324 and the second CGL 350. In addition, the second emitting stack ST2 may further include a second HTL 322 between the first CGL 330 and the second EML 324.

The third emitting stack ST3 includes a third EML 344 between the second CGL 350 and the second electrode 154 and a third ETL 346 between the third EML 344 and the second electrode 154. The third emitting stack ST3 may further include at least one of a third HTL 342 between the second CGL 350 and the third EML 344 and an EIL 348 between the third ETL 346 and the second electrode 154.

The first CGL 330 is positioned between the first emitting part ST1 and the second emitting part ST2. Namely, the first and second emitting stacks ST1 and ST2 are connected through the first CGL 330. The first CGL 330 may be a P-N junction CGL of a first N-type CGL 330N and a first P-type CGL 330P.

The first N-type CGL 330N is positioned between the first ETL 318 and the second HTL 322, and the first P-type CGL 330P is positioned between the first N-type CGL 330N and the second HTL 322. The first N-type CGL 330N contacts the first ETL 318.

The second CGL 350 is positioned between the second emitting part ST2 and the third emitting part ST3. Namely, the second and third emitting stacks ST2 and ST3 are connected through the second CGL 350. The second CGL 350 may be a P-N junction CGL of a second N-type CGL 350N and a second P-type CGL 350P.

The second N-type CGL 350N is positioned between the second ETL 326 and the third HTL 342, and the second P-type CGL 350P is positioned between the second N-type CGL 350N and the third HTL 342. The second N-type CGL 350N contacts the second ETL 326.

The first and second CGLs 330 and 350 generate charges or separate the holes and the electrons such that the electron and the hole are provided into the first to third emitting stacks ST1 to ST3, respectively.

Namely, in the first CGL 330, the first N-type CGL 330N provides the electron into the first ETL 318 of the first emitting stack ST1, and the first P-type CGL 330P provides the hole into the second HTL 322 of the second emitting stack ST2.

In the second CGL 350, the second N-type CGL 350N provides the electron into the second ETL 326 of the second emitting stack ST2, and the second P-type CGL 350P provides the hole into the third HTL 342 of the third emitting stack ST3.

Accordingly, in the emitting diode D including a plurality of emitting layers, the emitting efficiency is improved, and the driving voltage is lowered.

Each of the first and third EMLs 316 and 344 may be a blue EML, and the second EML 324 may be a yellow-green EML. The second EML 324 may further include a red EML to have a double-layered structure.

The first ETL 318 includes an electron transporting material of Formula 1, and each of the second and third ETLs 326 and 346 independently includes an electron transporting material selected from the group consisting of the compound of Formula 1, tris(8-hydroxy-quinolinato)aluminum (Alq3), 2-(4-biphenyl)-5-(4-tertbutylphenyl)-1,3,4-oxadiazole (PBD), 3-(4-biphenyl)-4-phenyl-5-tertbutylphenyl-1,2,4-triazole TAZ) and Bis(2-methyl-8-quinolinolate)-4-(phenylphenolato)aluminum (BAlq). The material of the first to third ETLs 318, 326 and 346 may be same or different.

The electron transporting material of Formula 1 or 2 has high durability or reliability against the hole such that thermal degradation of the first ETL 318 and/or the second and third ETLs 326 and 346 is improved. Accordingly, the lifespan of the emitting diode D is improved.

At least one of the first N-type CGL 330N and the second N-type CGL 350N includes a material of Formula 3. The material of Formula 3 or 4 for the first and second N-type CGLs 330N and 350N has high stability in high temperature such that thermal degradation of the emitting diode D in high temperature is prevented.

As mentioned above, in the emitting diode D of the present disclosure, the first ETL 318 includes the electron transporting material, which includes pyrimidine core, having high durability or reliability against the hole, and the first N-type CGL 330N includes the material having high stability in high temperature. As a result, the lifespan decrease of the emitting diode D in high temperature is prevented.

On the other hand, since the first ETL 318 has relatively small thickness, a tunneling effect is provided such that the problem of the electron transport is prevented.

Namely, the first ETL 318 has a first thickness t1, and the first thickness t1 is smaller than a third thickness t3 of the first N-type CGL 330N and/or a second thickness t2 of the third ETL 346, which is adjacent to the second electrode 154 as the cathode. In addition, the first thickness t1 may be smaller than a fourth thickness t4 of the second ETL 326 and a fifth thickness t5 of the second N-type CGL 350N.

For example, the first thickness t1 may be approximately 30 to 150 Å, and each of the second to fifth thicknesses t2 to t5 may be approximately 150 to 300 Å. The first thickness t1 of the first ETL 318 may be approximately 30 to 100 Å.

In the second emitting stack ST2 including the second EML 324, which is a phosphorescent yellow-green emitting layer, the electron mobility and the thickness of the second ETL 326 are respectively greater than those of the second N-type CGL 350N adjacent to the second ETL 326.

In the first emitting stack ST1 including the first EML 316, which is a fluorescent blue emitting layer, to secure the durability (or reliability) against the hole and the stability in high temperature, the first ETL 318 includes the material of Formula 1 or 2, and the first N-type CGL 330N includes the material of Formula 3 or 4. In this instance, since the electron mobility of the first ETL 318 is smaller than that of the first N-type CGL 330N, the thickness of the first ETL 318 is smaller than that of the first N-type CGL 330N and/or the third ETL 346.

In the emitting diode D of the present disclosure, the first and second ETLs 318 and 326 include the electron transporting material of Formula 1 or 2, and the first and second N-type CGLs 330N and 350N include the material of Formula 3 or 4. As a result, the lifespan decrease of the emitting diode D in high temperature is prevented. In addition, since the first and second ETLs 318 and 326, which have relatively low electron mobility, have relatively thin profile, the emitting efficiency decrease of the emitting diode D is prevented.

The lifespan and the emitting efficiency of the three-stack emitting diode of FIG. 5 are measured according to materials of the first ETL 318 and the first N-type CGL 330N.

Comparative Example 1 (Ref1)

A material of Formula 5 is used for the first ETL, and a material of Formula 6 is used for the first N-type CGL.

Comparative Example 2 (Ref2)

The material of Formula 2 is used for the first ETL, and the material of Formula 6 is used for the first N-type CGL.

Comparative Example 3 (Ref3)

The material of Formula 4 is used for the first ETL, and the material of Formula 2 is used for the first N-type CGL.

Comparative Example 4 (Ref4)

The material of Formula 5 is used for the first ETL, and the material of Formula 2 is used for the first N-type CGL.

Example (Ex)

The material of Formula 2 is used for the first ETL, and the material of Formula 4 is used for the first N-type CGL.

[Formula 5]

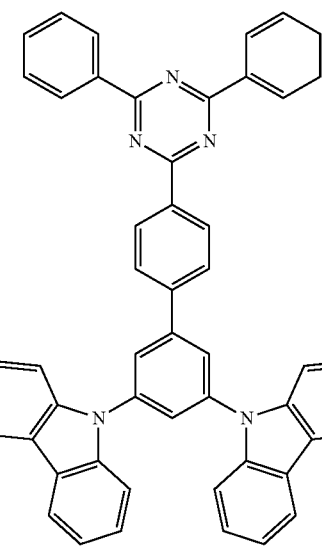

[Formula 6]

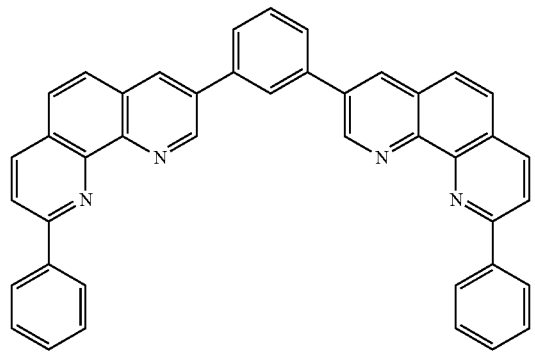

In the condition of 60° C. and 22.5 mA/cm², the driving voltage (V) and the lifespan of the emitting diodes of Comparative Examples 3 and 4 and Example are measured and listed in Table 1. The voltage is a relative value, and the lifespan is a relative value of a time taking to be 95% of initial brightness.

TABLE 1

|  | Ref3 | Ref4 | Ex |
|---|---|---|---|
| Voltage | 123% | 100% | 100% |
| Lifespan | 19% | 90% | 100% |

As shown in Table 1, in comparison to the emitting diode of Example, in the emitting diode of Comparative Example 3, where the material of the first ETL and the material of the first N-type CGL are exchanged, the driving voltage is significantly increased, and the lifespan is significantly decreased. In the emitting diode of Comparative Example 4, since the first ETL includes a triazine core material, which has weak durability against to the hole, the lifespan is decreased in comparison to the emitting diode of Example.

The lifespan of the emitting diodes of Comparative Examples 1 and 2 and Example according to the temperature and the current density are measured and listed in Table 2.

TABLE 2

|  | T [° C.] | Current density [mA/cm2] | Ref1 | Ref2 | Ex |
|---|---|---|---|---|---|
| Lifespan | 25 | 10 | 100% | 107% | 114% |
|  |  | 22.5 | 100% | 97% | 117% |
|  |  | 40 | 100% | 107% | 113% |
|  |  | 60 | 100% | 100% | 102% |
|  | 40 | 10 | 100% | 117% | 131% |
|  |  | 22.5 | 100% | 101% | 107% |
|  |  | 40 | 100% | 100% | 108% |
|  |  | 60 | 100% | 104% | 111% |
|  | 60 | 10 | 100% | 140% | 130% |
|  |  | 22.5 | 100% | 107% | 126% |
|  |  | 40 | 100% | 100% | 103% |
|  |  | 60 | 100% | 105% | 126% |

As shown in Table 2, in comparison to the emitting diodes of Comparative Examples 1 and 2, the lifespan of the emitting diode of Example is improved. Particularly, the lifespan of the emitting diode in high temperature is significantly improved.

In the emitting diode and the EL display device of the present disclosure, the first ETL of the first emitting stack, which includes a blue fluorescent emitting layer, includes the electron transporting material of Formula 1 or 2, and the first N-type CGL, which is adjacent to the first ETL, includes the material of Formula 3 or 4. As a result, the lifespan decrease of the emitting diode D by the hole and in high temperature is prevented.

In addition, since the first ETL, which has the electron mobility being smaller than the first N-type CGL, has a thickness being smaller than the first N-type CGL and/or an ETL, which is adjacent to the second electrode as the cathode, the emitting efficiency decrease is prevented.

It will be apparent to those skilled in the art that various modifications and variations can be made in the present disclosure without departing from the spirit or scope of the present disclosure. Thus, it is intended that the present disclosure cover the modifications and variations of the present disclosure provided they come within the scope of the appended claims and their equivalents.

What is claimed is:

1. A light emitting diode, comprising:
first and second electrodes facing each other;
a first charge generation layer between the first and second electrodes;
a first emitting stack including a first emitting material layer between the first electrode and the first charge generation layer and a first electron transporting layer between the first emitting material layer and the first charge generation layer; and
a second emitting stack including a second emitting material layer between the first charge generation layer and the second electrode and a second electron transporting layer between the second emitting material layer and the second electrode,
wherein the first charge generation layer has an electron mobility greater than that of the first electron transporting layer.

2. The light emitting diode according to claim 1, wherein the electron mobility of the first charge generation layer is in a range of $5*10^{-5}$ cm$^2$/Vs~$1*10^{-4}$ cm$^2$/Vs, and the electron mobility of the first electron transporting layer is in a range of $1*10^{-6}$ cm$^2$/Vs~$1*10^{-5}$ cm$^2$/Vs.

3. The light emitting diode according to claim 1, wherein the first electron transporting layer has a thickness smaller than that of the second electron transporting layer.

4. The light emitting diode according to claim 3, wherein the thickness of the first electron transporting layer is in a range of 30 to 150 Å.

5. The light emitting diode according to claim 1, wherein the first electron transporting layer has a thickness smaller than that of the first charge generation layer.

6. The light emitting diode according to claim 1, wherein the first electron transporting layer includes a material of Formula 1, and the first charge generation layer includes a material of Formula 2:

[Formula 1]

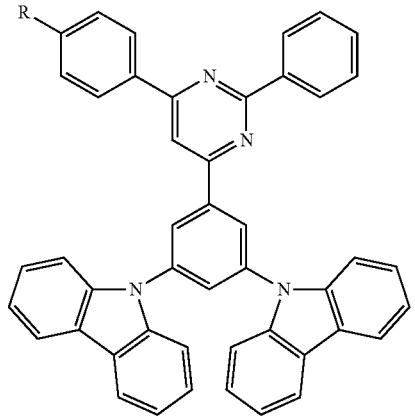

[Formula 2]

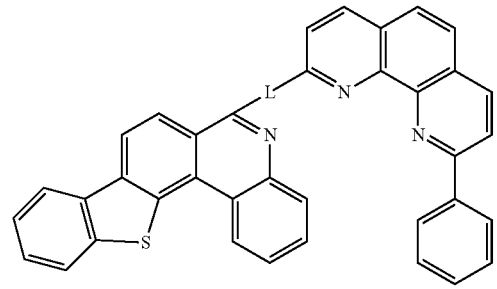

wherein R is C6 to C30 aryl group, and L is C6 to C30 arylene group.

7. The light emitting diode according to claim 6, wherein the first electron transporting layer includes a material of Formula 3, and the first charge generation layer includes a material of Formula 4:

[Formula 3]

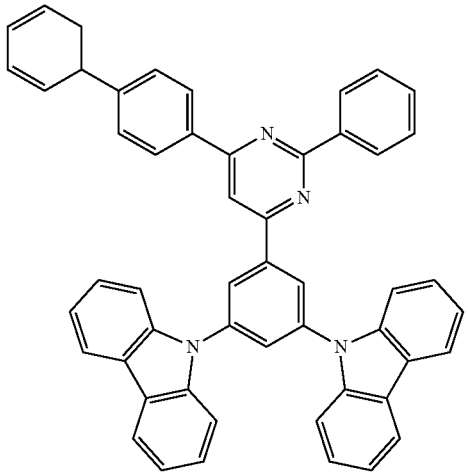

[Formula 4]

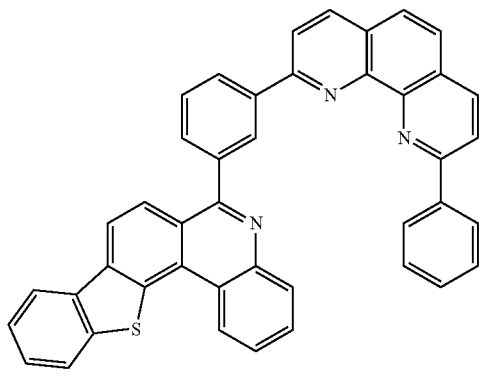

8. The light emitting diode according to claim 1, further comprising:
a second charge generation layer between the first charge generation layer and the second emitting stack; and
a third emitting stack between the first charge generation layer and the second charge generation layer and including a third emitting material layer and a third electron transporting layer between the third emitting material layer and the second charge generation layer.

9. The light emitting diode according to claim 8, wherein the first electron transporting layer has a thickness smaller than that of the third electron transporting layer.

10. The light emitting diode according to claim 8, wherein the first electron transporting layer has a thickness smaller than that of the second charge generation layer.

11. An electroluminescent display device, comprising:
a substrate;
a light emitting diode on the substrate, the emitting diode comprising:
first and second electrodes facing each other;
a first charge generation layer between the first and second electrodes;
a first emitting stack including a first emitting material layer between the first electrode and the first charge generation layer and a first electron transporting layer between the first emitting material layer and the first charge generation layer; and
s second emitting stack including a second emitting material layer between the first charge generation layer and the second electrode and a second electron transporting layer between the second emitting material layer and the second electrode;
a thin film transistor positioned between the substrate and the light emitting diode and electrically connected to the light emitting diode,
wherein the first charge generation layer has an electron mobility greater than that of the first electron transporting layer.

12. The electroluminescent display device according to claim 11, wherein the electron mobility of the first charge generation layer is in a range of $5*10^{-5}$ cm²/Vs~$1*10^{-4}$ cm²/Vs, and the electron mobility of the first electron transporting layer is in a range of $1*10^{-6}$ cm²/Vs~$1*10^{-5}$ cm²/Vs.

13. The electroluminescent display device according to claim 11, wherein the first electron transporting layer has a thickness smaller than that of the second electron transporting layer.

14. The electroluminescent display device according to claim 13, wherein the thickness of the first electron transporting layer is in a range of 30 to 150 Å.

15. The electroluminescent display device according to claim 11, wherein the first electron transporting layer has a thickness smaller than that of the first charge generation layer.

16. The electroluminescent display device according to claim 11, wherein the first electron transporting layer includes a material of Formula 1, and the first charge generation layer includes a material of Formula 2:

[Formula 1]

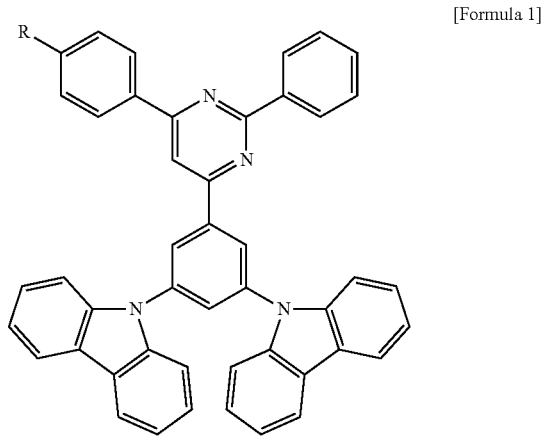

[Formula 2]

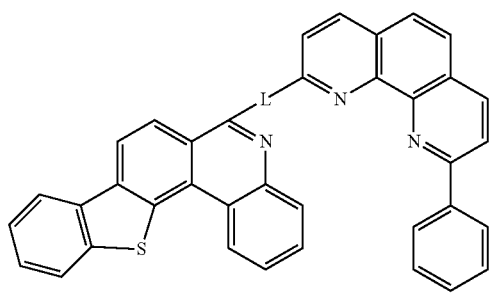

wherein R is C6 to C30 aryl group, and L is C6 to C30 arylene group.

17. The electroluminescent display device according to claim 16, wherein the first electron transporting layer includes a material of Formula 3, and the first charge generation layer includes a material of Formula 4:

[Formula 3]

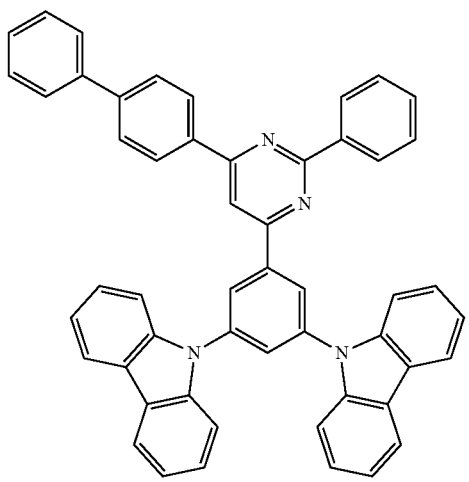

[Formula 4]

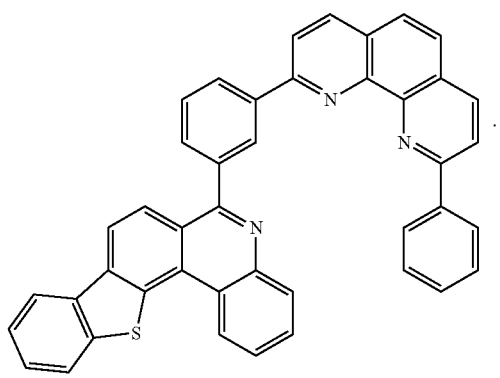

18. The electroluminescent display device according to claim 11, wherein the light emitting diode further comprises:
 a second charge generation layer between the first charge generation layer and the second emitting stack; and
 a third emitting stack between the first charge generation layer and the second charge generation layer and including a third emitting material layer and a third electron transporting layer between the third emitting material layer and the second charge generation layer.

19. The electroluminescent display device according to claim 18, wherein the first electron transporting layer has a thickness smaller than that of the third electron transporting layer, and the first electron transporting layer has a thickness smaller than that of the second charge generation layer.

20. The electroluminescent display device according to claim 11, further comprising:
 red, green and blue color filter patterns respectively corresponding to red, green and blue pixel regions,
 wherein the light emitting diode corresponds to all of the red, green and blue pixel regions, and
 wherein the red, green and blue color filter patterns are positioned between the substrate and the light emitting diode or over the light emitting diode.

* * * * *